United States Patent
Sternowski

(10) Patent No.: US 10,067,172 B1
(45) Date of Patent: Sep. 4, 2018

(54) FAR-FIELD ANTENNA PATTERN CHARACTERIZATION VIA DRONE/UAS PLATFORM

(71) Applicant: Softronics, Ltd., Marion, IA (US)

(72) Inventor: Robert H. Sternowski, Cedar Rapids, IA (US)

(73) Assignee: Softronics, Ltd., Marion, IA (US)

( * ) Notice: Subject to any disclaimer, the term of this patent is extended or adjusted under 35 U.S.C. 154(b) by 129 days.

(21) Appl. No.: 15/361,795

(22) Filed: Nov. 28, 2016

Related U.S. Application Data

(60) Provisional application No. 62/364,977, filed on Jul. 21, 2016.

(51) Int. Cl.
| | |
|---|---|
| G01R 29/10 | (2006.01) |
| B64C 39/02 | (2006.01) |
| G08G 5/00 | (2006.01) |
| G01R 29/08 | (2006.01) |
| G05D 1/00 | (2006.01) |
| G05D 1/10 | (2006.01) |

(52) U.S. Cl.
CPC ............ *G01R 29/10* (2013.01); *B64C 39/024* (2013.01); *G01R 29/0878* (2013.01); *G05D 1/0011* (2013.01); *G05D 1/101* (2013.01); *G08G 5/003* (2013.01); *G08G 5/0013* (2013.01); *G08G 5/0069* (2013.01); *B64C 2201/146* (2013.01)

(58) Field of Classification Search
CPC .. G01R 29/10; G01R 29/0878; B64C 39/024; B64C 2201/146; G08G 5/003; G08G 5/0013; G08G 5/0069; G05D 1/101; G05D 1/0011

USPC .......................................................... 701/1, 2
See application file for complete search history.

(56) References Cited

U.S. PATENT DOCUMENTS

| | | | | |
|---|---|---|---|---|
| 4,989,011 | A * | 1/1991 | Rosen | H01Q 3/40 342/373 |
| 5,027,127 | A * | 6/1991 | Shnitkin | H01Q 3/267 342/174 |
| 5,396,255 | A | 3/1995 | Durkota et al. | |
| 6,344,837 | B1 | 2/2002 | Gelsey | |
| 6,657,596 | B2 * | 12/2003 | Djuknic | G01R 29/10 343/703 |
| 6,750,822 | B2 * | 6/2004 | Fritzel | G01R 29/10 343/703 |
| 7,119,739 | B1 * | 10/2006 | Struckman | G01R 29/10 342/174 |
| 7,978,407 | B1 | 7/2011 | Connor | |

(Continued)

*Primary Examiner* — Jaime Figueroa
(74) *Attorney, Agent, or Firm* — Shuttleworth & Ingersoll, PLC; Jason Sytsma

(57) ABSTRACT

A far-field antenna characterization system for characterizing a far-field antenna pattern of a target antenna. An unmanned aircraft system ("UAS") with a flight control system receives preprogrammed flight instructions for maneuvering the UAS within the far-field antenna pattern of the target antenna. A sensing antenna mounted to the UAS senses the far-field antenna pattern of the target antenna. A power measurement sensor provides a power level signal indicative thereof. A position measurement sensor provides a position signal for the UAS. The data logger associates the power level signal with the position signal at multiple measurement points to create a power density pattern for the far-field antenna pattern.

20 Claims, 5 Drawing Sheets

(56) References Cited

U.S. PATENT DOCUMENTS

| | | | |
|---|---|---|---|
| 8,077,098 B2* | 12/2011 | Snow | G01R 29/10 |
| | | | 342/169 |
| 2003/0122078 A1* | 7/2003 | Fritzel | G01R 29/10 |
| | | | 250/336.1 |
| 2003/0142023 A1* | 7/2003 | Djuknic | G01R 29/10 |
| | | | 343/703 |
| 2008/0158671 A1 | 7/2008 | Lee | |
| 2009/0140852 A1* | 6/2009 | Stolarczyk | H01Q 1/04 |
| | | | 340/539.13 |
| 2009/0189816 A1* | 7/2009 | Nikitin | H01Q 1/2208 |
| | | | 343/702 |
| 2009/0284425 A1* | 11/2009 | Snow | G01R 29/10 |
| | | | 343/703 |
| 2013/0214971 A1* | 8/2013 | Robinson | G01R 29/10 |
| | | | 342/360 |
| 2013/0285853 A1* | 10/2013 | Lee | H04W 24/08 |
| | | | 342/368 |
| 2014/0043172 A1* | 2/2014 | Manobianco | G08C 17/02 |
| | | | 340/870.07 |
| 2014/0057571 A1* | 2/2014 | Oh | H04B 17/0032 |
| | | | 455/67.11 |
| 2014/0300519 A1* | 10/2014 | Estebe | H01Q 3/267 |
| | | | 343/703 |

* cited by examiner

FAR-FIELD ANTENNA PATTERN CHARACTERIZATION VIA DRONE/UAS PLATFORM

This application claims priority to U.S. Provisional Application No. 62/364,977 filed on Jul. 21, 2016, the contents of which are hereby incorporated by reference herein.

BACKGROUND

A long-standing deficiency in far-field antenna pattern characterization has been empirical determination of patterns of antennas on large mobile and/or fixed platforms. While computational electromagnetic codes can provide a reasonable estimate of most systems, there has been no ability to do a final "proof of performance" on very large systems (i.e., E-4B, KC-135, fixed stations, etc.) where the desired far-field measurement distance is too great and the platform too large. Knowledge of the platform antenna patterns would result in more accurate and confident system design and mission planning, and ultimately more reliable communications.

SUMMARY

Disclosed is a far-field antenna characterization system for characterizing a far-field antenna pattern of a target antenna. The target antenna can be one that is radiating substantially constant power at a desired frequency for the purposes of having its far-field pattern characterized. The far-field antenna characterization system comprises of an unmanned aircraft system ("UAS") with a flight control system for receiving preprogrammed flight instructions for maneuvering the UAS within the far-field antenna pattern of the target antenna. Or, a manned aircraft manually flown in the far-field antenna pattern. A sensing antenna can be mounted to the UAS for sensing the far-field antenna pattern of the target antenna. A power measurement sensor can be coupled to the sensing antenna for providing a power level signal indicative thereof. A position measurement sensor is used to provide a position signal for the UAS. A data logger is coupled to the power measurement sensor for receiving the power level signal. The data logger is also coupled to the position measurement sensor for receiving the position signal. The data logger associates the power level signal with the position signal at multiple measurement points to create a power density pattern for the far-field antenna pattern.

The far-field antenna characterization system can comprise a signal conditioning circuit coupled between the sensing antenna and the power measurement sensor for removing out-of-band frequencies. The signal conditioning circuit can include a fixed, narrowband filter coupled to a low-noise amplifier to remove out-of-band energy.

The sensing antenna and the target antenna should be configured to have a matching polarization. In one implementation, the sensing antenna can be an isotropic antenna with substantially equal gain over a hemisphere. The isotropic antenna can be oriented horizontally with respect to a ground surface, which will provide accurate measurements regardless of the elevation angle relative to target antenna.

A base station can be configured for receiving the associated power level signal and the position signal either downlinked in real time or retrieved post flight, and in response calculating from the position signal for each measurement point a distance to the target antenna from where the power level signal was obtained and normalizing the distance for each measurement point for generating the power density pattern for the far-field antenna pattern. A display coupled to the base station can be used to present the power density pattern for the far-field antenna pattern in a spherical pattern to a user.

DETAILED DESCRIPTION

Figure 1:
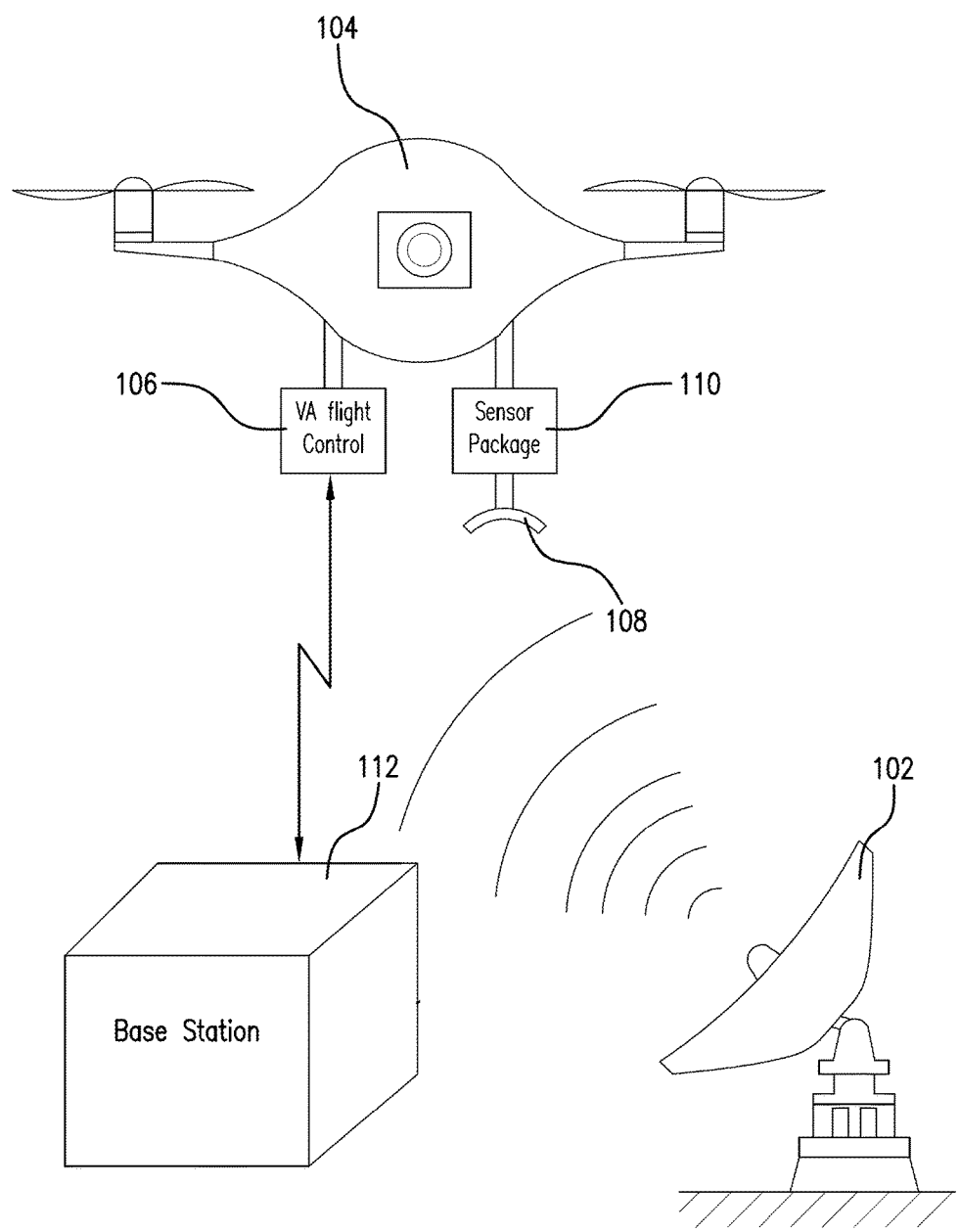
FIG. 1 illustrates far-field antenna characterization via drone/UAS system, according to one embodiment described herein.

Disclosed is a far-field antenna characterization via drone/UAS system 100 for characterizing a far-field antenna pattern from a target antenna 102 radiating substantially constant power at a desired frequency. In general, far-field antenna characterization via drone/UAS system 100 comprises of an unmanned aircraft system ("UAS") 104, otherwise known as a drone, comprising a flight control system 106 for receiving preprogrammed flight instructions for maneuvering UAS 104 within the far-field antenna pattern of target antenna 102. A sensing antenna 108 can be mounted to UAS 104 for sensing the far-field antenna pattern of target antenna 102. A sensor module 110 can be mounted to UAS 104 for receiving signals from sensing antenna 108 and determining a power density pattern of the far-field antenna pattern of target antenna 102.

There are some assumptions that can be made about target antenna 102 that are useful for its characterization. The radiated signal from target antenna 102 can be assumed constant. Any variation in output power produces an equal variation—and error—in the measured power. If the native transmitter (e.g., the transmitter normally used with target antenna 102) is not sufficiently stable, standard general purpose electronic test equipment can be substituted to obtain the necessary stable signal—zero error contribution can be assumed.

It can also be assumed that the orientation of an axis of target antenna 102 can be measured to any desired degree of accuracy, and target antenna 102 does not move during measurements—zero error contribution can be assumed. Similarly, it can also be assumed that the location of target antenna 102 can be measured to any desired degree of accuracy. Also, given a clear line-of-sight path from UAS 104 to target antenna 102, a constant free space loss exponent of 2.0 can be assumed, with zero error contribution.

In performing outdoor in situ antenna pattern characterization, the greatest random error variable comes from external interference in the form of other radio signals summing with the target signal from target antenna 102 in the passband of the measurement sensor (i.e., signal conditioning circuit 114 of sensor module 110). As a rule of thumb, an interfering signal 10 db lower in power than the target signal will cause a 1 db (high) power measurement error. If, however, the interfering signals are higher in power than the target signal, then valid measurements are more difficult. The following approaches can prevent this error from being significant.

First, the narrowest possible filter between sensing antenna 108 and a power meter 120 can prevent all but the target signal from reaching power meter 120, and block other external signals from causing errors. Second, the highest allowed target signal power from target antenna 102 should "overwhelm" any potential interfering signals at sensing antenna 108 given the close proximity of UAS 104 to target antenna 102. Third, the tester can check the spectral occupancy vs time of day at the in situ test site to verify that the test frequency is unoccupied. If the frequency is occupied by other strong signal power users, the tester can move the test frequency to a different frequency in the same band. If appropriate, the tester can fly UAS 104 in a test pattern simulating the planned antenna measurement flight pattern and record the ambient signal energy present. Also, night time is often a less active signal time in the line-of-sight bands. Finally, a pulsed measurement system can be used. A 1-point per second ("PPS") GPS synchronization signal can be used for taking measurements, but the "valid" transmitted target signal is pulsed and present only for the first 100 milliseconds, for example, starting at the 1 PPS synch pulse. During the other 900 milliseconds, the power measurement system 100 monitors ambient signal energy and records the power of the interfering signals for consideration in later data reduction to determine the validity of the measurement points. Interfering power is not necessarily constant, either in power or with change in the location of UAS 104, so it is useful to know what measurement points are invalid due to interference so they can be discarded.

More specifically, the present disclosure provides a far-field antenna characterization via drone/UAS system 100 implemented on UAS 104. UAS 104 may be any type of unmanned or autonomous aircraft system. In one embodiment, UAS 104 can be controlled either by an internal controller (i.e., flight control system 106) or by an external system without receiving instructions from a human operator. In one embodiment, the UAS 104 may be controlled by a human operator in the event of an emergency or if the internal and/or external controller systems fail. As will be discussed in detail below, the UAS 104 receives a predetermined path to traverse from a base station 112; however, if a human operator observing the UAS 104 determines the UAS 104 is about to collide with an object or is behaving erratically, the operator may override flight control system 106 and safely navigate the UAS 104. Also, if the operator believes that UAS 104 is not obtaining the necessary data points of the far-field antenna pattern of target antenna 102, the operator may override flight control system 106 and safely navigate the UAS 104 around the far field antenna pattern.

UAS 104 includes flight control system 106, which is used to provide two-way communication between UAS 104 and base station 112. Flight control information including flight path information originating from base station 112 can be communicated to UAS 104 through a wired or wireless connection, or UAS 104 can be pre-programmed prior to flight. The flight path can be randomized or imprecise. In fact, the actual flight path may not be critical, because far-field antenna characterization via drone/UAS system 100 constantly gathers signal power measurements from target antenna 102 along with position measurements for UAS 104, as will be discussed in greater detail below. UAS 104 can be maneuvered in a rough pattern about the radiation pattern sector(s) of interest outside of the user-determined far-field transition zone (i.e., the approximate area where the antenna patter transitions from near-field to far-field). The ability to dynamically and effortlessly vary the measurement distance is a major advantage of power measurement system 100.

Figure 3:
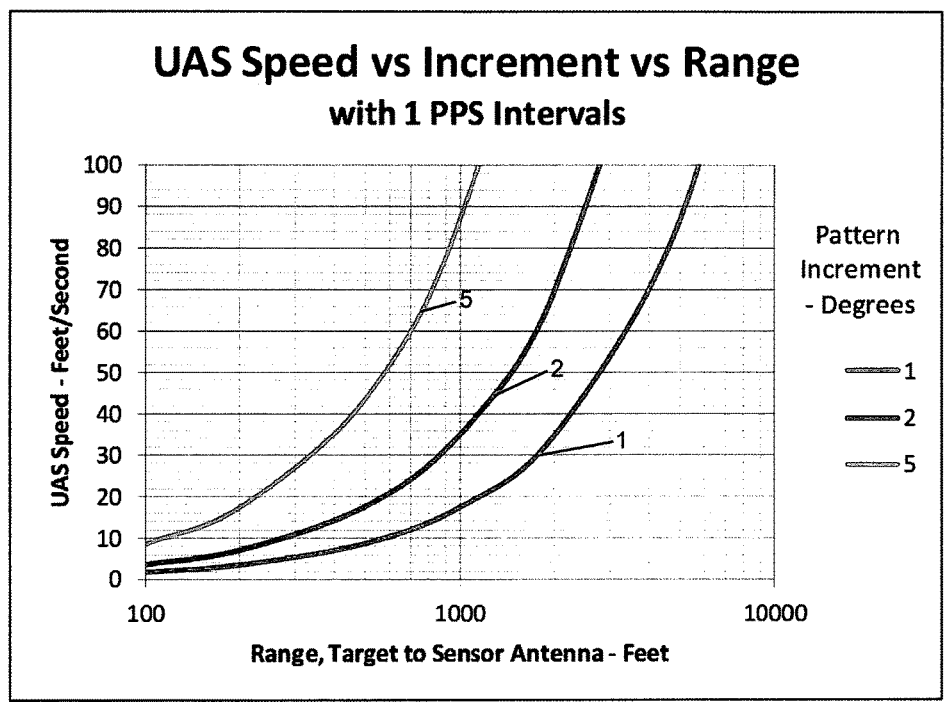
FIG. 3 is a graph of the speed of the drone/UAS of FIG. 1 compared to its range from the antenna of FIG. 1 at various distances.
Figure 4:
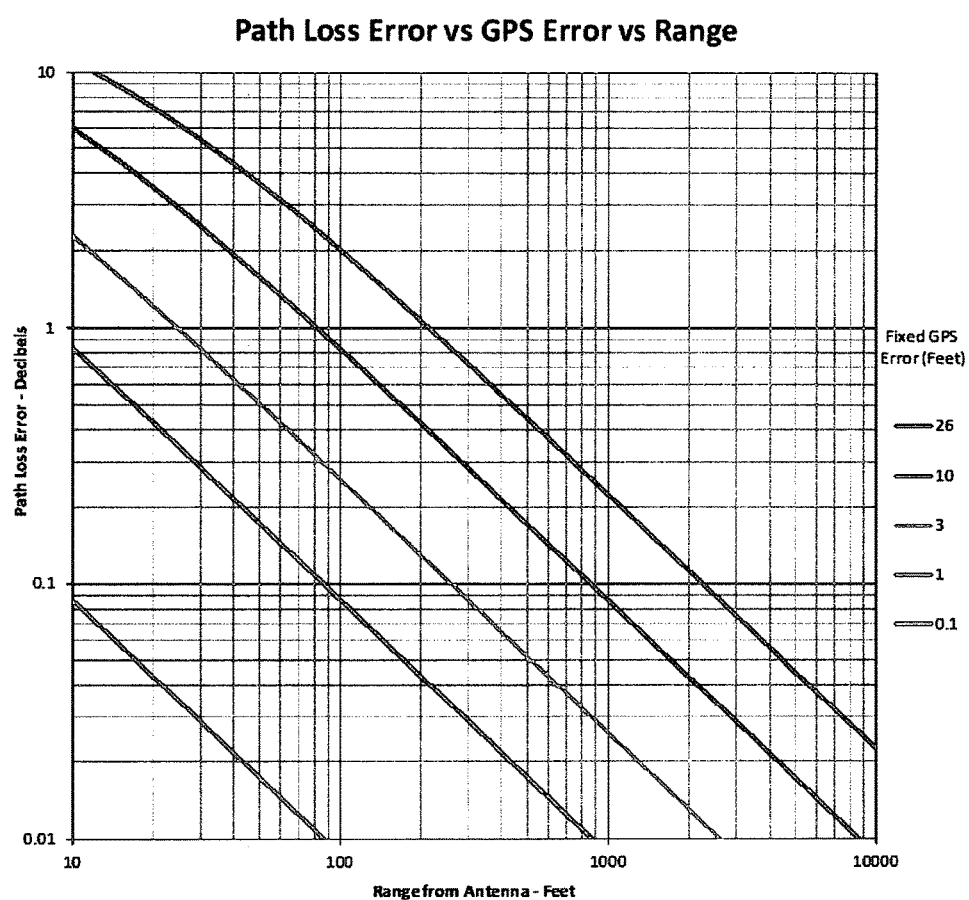
FIG. 4 is a graph comparing the path loss error to the range the drone of FIG. 1 is from the antenna.

FIG. 3 shows the maximum speed of UAS 104 versus range from target antenna 102 (select a minimum range to remain in the far-field) versus the desired angular pattern increments. UAS 104 of small-to-medium size will likely not fly faster than 22 ft/sec (about 15 mph), hence 1-degree increments are easily attained. 1-degree increments of antenna pattern gain are generally the finest increments used for antenna and system design, except for some very special applications at microwave frequencies. Those special applications are best served by conventional anechoic chamber measurement systems. Simultaneously, the GPS lat/long/alt data is logged for the 3-dimensional point at which the power of the signal from target antenna 102 is measured.

Figure 2:
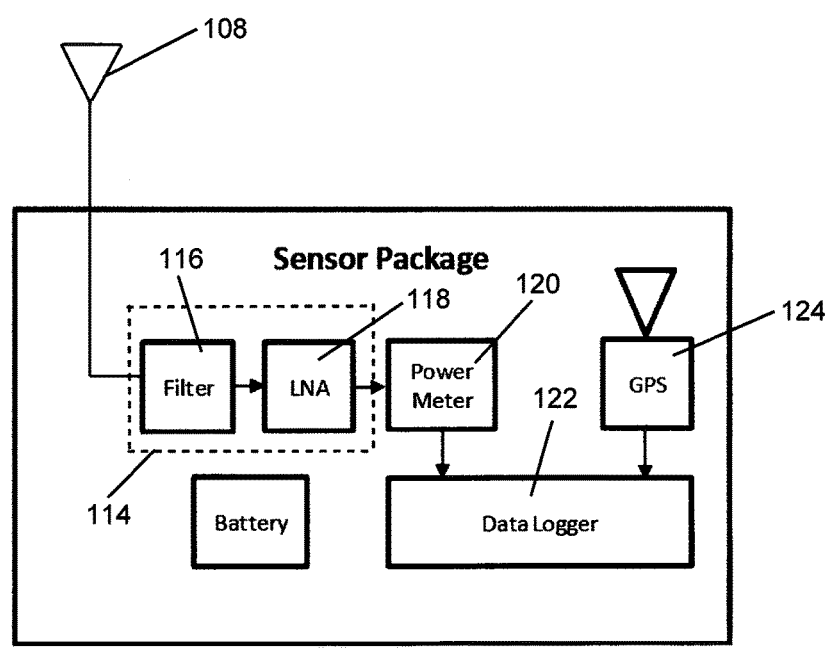
FIG. 2 is a block diagram of a circuit implemented in the system of FIG. 1

Sensor module 110 of power measurement system 100 is shown in FIG. 2. Sensor module 110 is coupled to sensing antenna 108. Sensing antenna 108 can be an isotropic antenna, which would have equal pattern gain over its whole hemisphere (ideally over the whole sphere). The simplest approach is to make sensing antenna 108 electrically short. The shorter sensing antenna 108 gets in terms of wavelengths, the more isotropic the pattern, until the dipole reaches ½ wavelength and the pattern becomes constant as length decreases.

Figure 5A:
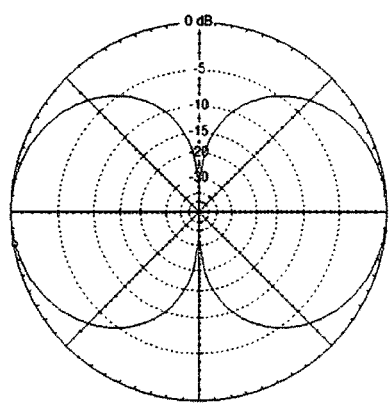
FIG. 5A is a graph of a 0.5 m Dipole at 100 MHz.
Figure 5B:
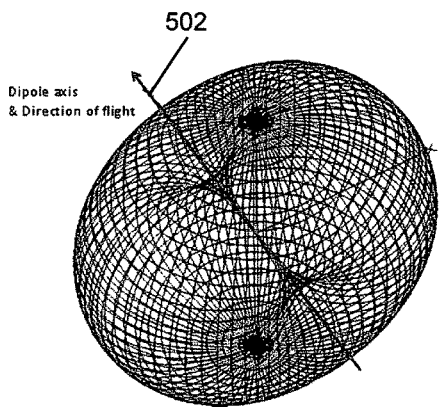
FIG. 5B is a graph of a 3D graph of a 0.5 Dipole at 100 MHz.
Figure 5C:
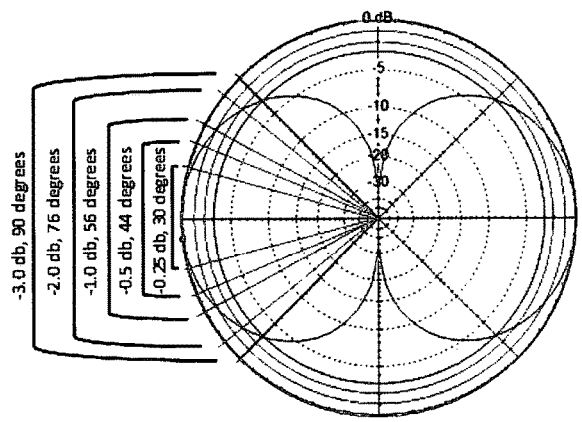
FIG. 5C is a graph of the azimuth pattern variation versus angle for the 0.5 m Dipole at 100 MHz.

FIG. 5 shows sensing antenna 108 with an antenna pattern of an electrically short dipole at 0.5 meters length at a frequency of 100 MHz (approximately 3 meter wavelength). Using the EZ-NEC™ electromagnetic code, sensing antenna 108 can be shown to have an expected constant-gain free space torus pattern about its long axis 502. This suggests that sensing antenna 108 configured as an isotropic dipole antenna mounted on UAS 104 that is oriented horizontally with respect to the ground during flight will provide accurate measurements regardless of the elevation angle relative to target antenna 102. It is advantageous to maintain sensing antenna 108 broadside to target antenna 102 by the heading and attitude of UAS 104. If sensing antenna 108 moves off-broadside, the resulting error in the true power measurement due to the pattern gain effects of sensing antenna 108 can be shown in FIG. 6. The worst case, over a 90 degree attitude span, is a 3 db error. If tighter accuracy is required, then other steps may be taken to improve the accuracy. If the heading or attitude of UAS 104 cannot be sufficiently accurately maintained, then the heading and attitude should be measured and recorded at each measurement point, so that a sense antenna pattern correction table can be applied for each point in the post-flight data reduction to remove the error. A combination of attitude control for UAS 104 and post-flight compensation can also be used.

Sensing antenna 108 can also be a vertical antenna. In this instance, sensing antenna 108 should be mounted vertically below UAS 104. In this case, the constant torus pattern is now in azimuth and the pattern variation is in elevation. The same approach to minimizing error applies: control the antenna orientation with the heading and attitude of UAS 104, or record the heading and attitude for later compensation—or use a combination of both techniques.

Sensing antenna 108 should have a polarization that matches the polarization of target antenna 102. The polarization error is a subset of the pattern error and is treated the same way as minimizing other antenna error; the orientation of sensing antenna 108 relative to target antenna 102 should be maintained by the attitude of UAS 104, or else the error measured at each point should be corrected for in the post-flight data reduction. The worst case is a 23 db classical loss when sensing antenna 108 and target antenna 102 are cross-polarized. This, however, would probably not occur, provided an initial matching of the polarization of the target antenna 102 and sensing antenna 108 is performed. A proper selection of sensing antenna 108, a proper mounting of sensing antenna 108 on UAS 104, and maintaining the proper heading and attitude of UAS 104 can minimize this error.

Sensor module 110 can comprise a signal conditioning circuit 114. Signal conditioning circuit 114 preprocesses the sensed signal received by sensing antenna 108. Signal conditioning circuit 114 can include any number of analog devices, such as one or more low pass or band-pass filters tuned for a pass-bad corresponding substantially to the frequency of target antenna 102, and one or more amplifiers 118, such as a low-noise amplifier (LNA) to enhance noise figure performance of the remaining circuitry to further help define the sensed signal and filter all other frequencies. Filter 116 in signal conditioning circuit 114 can be a passband filter with ideally a fixed, narrowband which will pass only the reference signal and reject ambient spectral energy present in the area of the test. Highly selective crystal filters are available up through the UHF range. Any extraneous spectral energy falling within the filter passband will sum with the reference signal and produce an erroneous measurement. Selection of a reference frequency, knowledge and monitoring of the ambient signal spectrum in the sample space, and selection of the specific characteristics of filter 116 all influence the accuracy of the power measurements by power meter 120.

Signal conditioning circuit 114 could also be omitted and the sensed signal can be sufficiently enhanced through digital signal processing techniques, including digital filtering and amplification. Also, if target antenna 102 is operated with the highest allowed signal power during testing, the signal should "overwhelm" any potential interfering signals received by sensing antenna 108, given the close proximity of the UAS 104 to target antenna 102. Automatic gain control in signal conditioning circuit 114 can reduce the gain of signal conditioning circuit 114 according to the maximum target power, thereby desensitizing sensor module 110 to other interfering signals of lesser power. Furthermore, if target antenna 102 is characterized at one frequency before proceeding to analyze target antenna 102 at another frequency, with the sensor frequency held constant, there should be no gain variation between measurements due to signal conditioning circuit 114 (which should have a constant gain).

A power meter 120 can be coupled to the output of signal conditioning circuit 114 to receive the conditioned sensed signal. Power meter 120 can be a logarithmic peak power detector implemented in an integrated circuit. Power meter 120 can have a specified measurement accuracy of typically ±0.25 db over a 60 db dynamic range up to 3 GHz, or up to 40 GHz with dynamic ranges of 40-50 db.

A datalogger 122 is connected to power meter 120 to gather signal power measurements from target antenna 102 along with 3D GPS location information of UAS 104. Datalogger 122 can record measurements at a rate of 1 PPS and store the data in non-volatile memory.

GPS unit 124 provides altitude and position information to datalogger 122 at rate of 1 PPS corresponding with the rate of power measurements to associate the power measurements with a specific 3D location.

After the necessary data has been gathered, the data from datalogger 122 can be transmitted to base station 112 for analysis, or recovered from datalogger 122 from UAS 104 post-flight. Base station 112 can be a remote computer system configured to receive the data comprising power measurements and 3D location information and normalize the data to a constant distance from target antenna 102. This normalization yields a matrix of pattern power measurement points all lying on a spherical surface about target antenna 102. This data set is the desired far-field pattern. More specifically, the data is normalized using the square law distance vs path loss relationship, which is valid at an exponent of 2.0 (represent the path-loss in free space) in an airborne line-of-sight path.

Base station 112 can have a corresponding display in order to provide the tester or anyone else with a visual representation of the far-field pattern. Such data may be typically presented as 2D (single "slice") or 3D graphical displays, as shown in FIGS. 5a and 5b respectively. Such a graph displays the gain (linear or logarithmic) versus angular displacement in a 2 or 3 dimensional coordinate reference system centered on the antenna center.

In another implementation, the far-field patter of target antenna 102 can be determined at multiple frequencies simultaneously. In this implementation, it is desirable to have parallel signal conditioning circuits and power meters to record the data. Or, multiple target antennas (at slightly different frequencies) on a platform could be scanned simultaneously by adding additional sensors to UAS 104, one per target antenna/frequency.

In another implementation, a swarm of independent UASs can be used, identically equipped, with each programmed to scan a separate sector. This allows completing a hemispherical scan much more rapidly, with little additional cost compared to the platform utilization time (the UAS is assumed to be relatively inexpensive).

In general, a manned aircraft can be substituted for UAS 104 for logistical or operational reasons. Sensor module 110 can generally be mounted without permanent modifications to the aircraft. An existing aircraft blade antenna, "borrowed" for the testing, is usually sufficient for sensing antenna 108, since only position-sensitive relative power measurements are being made.

In another implementation, this system could be applied to a non-stationary movable platform with a target antenna. A movable platform can be an aircraft in flight, a vehicle in motion, or a nautical vessel. Sensor module 110 could be installed on one or more "chase" aircraft that are safely, at far-field distances from the movable platform with the target antenna and flown about the movable platform. The target antenna can be in any location on the movable platform; for example, on a movable platform that is an aircraft, the target antenna can be on the top, bottom, wingtip, etc. An existing chase aircraft blade antenna (top or bottom mounted as appropriate) can be unplugged and used as the sense antenna for this testing to avoid modifications to the chase-aircraft. The target aircraft transmits the constant target signal, and sensor module 110 uses a GPS 1 pps datalogger for its GPS location and attitude and heading reference system (AHRS) data, so that the post-flight data analysis can compute the vector from the chase aircraft to the target movable platform for each data point. Also, systems like the Scope Command HF ground stations have not had pattern measurements made due to the near impossibility of measuring the far-field pattern in the 2-30 MHz range. Far-field antenna characterization via drone/UAS system 100 scales to 2-30 MHz with ease, using either UAS 104 or a larger manned "chase" aircraft (if necessary for altitude and range of measurements).

In yet another implementation, sensor module 110 can be placed on a manned aircraft that is manually flown in the far field antenna pattern with a similar result.

Far-field antenna characterization via drone/UAS system 100 can be utilized against an uncooperative target antenna for which radiated power and pattern must be estimated. Such intelligence gathering missions would be executed exactly as the described target antenna exercises but the location information for target antenna 102 would not be known in advance. Far-field antenna characterization via drone/UAS system 100 has the ability, without modification, to measure the absolute field strength of the target signal from target antenna 102, given that sensor module 110 has been calibrated for the antenna range.

Far-field antenna characterization via drone/UAS system 100 has the potential to characterize an antenna pattern in a manner never before possible with previous technology. The proposed equipment is simple and low cost, installable on a variety of user platforms, and easily and creatively applied in a variety of ways limited by the imagination of the tester.

Reference may also have been made throughout this disclosure to "one embodiment," "an embodiment," or "embodiments" meaning that a particular described feature, structure, or characteristic is included in at least one embodiment of the present invention. Thus, usage of such phrases may refer to more than just one embodiment. Furthermore, the described features, structures, or characteristics may be combined in any suitable manner in one or more embodiments.

While the present invention has been particularly shown and described with reference to exemplary embodiments thereof, it should be understood by those of ordinary skill in the art that various changes, substitutions and alterations can be made herein without departing from the spirit and scope of the invention as embodied by the appended claims and their equivalents.

What is claimed is:

1. A far-field antenna characterization system for characterizing a far-field antenna pattern of a target antenna that is radiating substantially constant power at a desired frequency, the far-field antenna characterization system comprising:
   an unmanned aircraft system ("UAS") comprising a flight control system for receiving preprogrammed flight instructions for maneuvering the UAS within the far-field antenna pattern of the target antenna;
   a sensing antenna mounted to the UAS for sensing the far-field antenna pattern of the target antenna;
   a power measurement sensor coupled to the sensing antenna for providing a power level signal indicative thereof;
   a position measurement sensor for providing position signal for the UAS;
   a data logger coupled to the power measurement sensor for receiving the power level signal, and the data logger coupled to the position measurement sensor for receiving the position signal, and the data logger associates the power level signal with the position signal at multiple measurement points to create a power density pattern for the far-field antenna pattern.

2. The far-field antenna characterization system of claim 1, and further comprising a signal conditioning circuit coupled between the sensing antenna and the power measurement sensor for removing out-of-band frequencies.

3. The far-field antenna characterization system of claim 1, and further comprising a base station configured for receiving the associated power level signal and the position signal and in response calculating from the position signal for each measurement point a distance to the target antenna from where the power level signal was obtained and normalizing the distance for each measurement point for generating the power density pattern for the far-field antenna pattern.

4. The far-field antenna characterization system of claim 3, and further comprising a display coupled to the base station for presenting the power density pattern for the far-field antenna pattern in a spherical pattern to a user.

5. The far-field antenna characterization system of claim 2, wherein the sensing antenna is an isotropic antenna with substantially equal gain over a hemisphere.

6. The far-field antenna characterization system of claim 5, wherein the isotropic antenna is oriented horizontally with respect to a ground surface.

7. The far-field antenna characterization system of claim 2, wherein the signal conditioning circuit includes a fixed, narrowband filter coupled to a low-noise amplifier.

8. The far-field antenna characterization system of claim 1, wherein the sensing antenna is a vertical antenna mounted vertically below the UAS.

9. The far-field antenna characterization system of claim 1, wherein the sensing antenna and the target antenna have a matching polarization.

10. The far-field antenna characterization system of claim 1, wherein power measurement sensor is a logarithmic peak power detector.

11. A far-field antenna characterization system for characterizing a far-field antenna pattern of a target antenna that is radiating substantially constant power at a desired frequency, the far-field antenna characterization system comprising:
    an aircraft for maneuvering the far-field antenna characterization system in the far-field antenna pattern;
    a sensing antenna mounted to the aircraft for sensing the far-field antenna pattern of the target antenna;
    a power measurement sensor coupled to the sensing antenna for providing a power level signal indicative thereof;
    a position measurement sensor for providing position signal for the aircraft;
    a data logger coupled to the power measurement sensor for receiving the power level signal, and the data logger coupled to the position measurement sensor for receiving the position signal, and the data logger associates the power level signal with the position signal at multiple measurement points to create a power density pattern for the far-field antenna pattern.

12. The far-field antenna characterization system of claim 11, wherein the aircraft in one chosen from an unmanned aircraft system and a manned aircraft.

13. The far-field antenna characterization system of claim 11, wherein the target antenna is non-stationary on a movable platform.

14. The far-field antenna characterization system of claim 11, and further comprising: a base station configured for receiving the associated power level signal and the position signal and in response calculating from the position signal for each measurement point a distance to the target antenna from where the power level signal was obtained and normalizing the distance for each measurement point for generating the power density pattern for the far-field antenna pattern; and a display coupled to the base station for presenting the power density pattern for the far-field antenna pattern in a spherical pattern to a user.

15. A method for characterizing a far-field antenna pattern of a target antenna that is radiating substantially constant power at a desired frequency, the method comprising:
- maneuvering an aircraft within the far-field antenna pattern of the target antenna;
- sensing with a sensing antenna the far-field antenna pattern of the target antenna;
- measuring a power level signal of the far-field antenna;
- determining a position signal for the aircraft simultaneously with measuring the power level signal;
- associating the power level signal with the position signal at multiple measurement points; and
- creating a power density pattern for the far-field antenna pattern.

16. The method of claim 15, and further comprising calculating from the position signal for each measurement point a distance to the target antenna from where the power level signal was obtained.

17. The method of claim 16, and further comprising normalizing the distance for each measurement point for generating the power density pattern for the far-field antenna pattern.

18. The method of claim 17, displaying the power density pattern for the far-field antenna pattern in a spherical pattern.

19. The method of claim 15, and further comprising maneuvering the aircraft so that the sensing antenna is oriented horizontally with respect to a ground while sensing the far-field antenna pattern of the target antenna.

20. The method of claim 19, and further comprising maneuvering the aircraft and maintaining the sensing antenna broadside to the target antenna while sensing the far-field antenna pattern of the target antenna.

* * * * *